(12) United States Patent
Bench et al.

(10) Patent No.: US 7,655,127 B2
(45) Date of Patent: Feb. 2, 2010

(54) METHOD OF FABRICATING THIN FILM TRANSISTOR

(75) Inventors: Michael W. Bench, Eagan, MN (US); Steven D. Theiss, Woodbury, MN (US); Grace L. Ho, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 251 days.

(21) Appl. No.: 11/563,454

(22) Filed: Nov. 27, 2006

(65) Prior Publication Data

US 2008/0121528 A1    May 29, 2008

(51) Int. Cl.
    C25D 5/48    (2006.01)
(52) U.S. Cl. ........................................ 205/221; 205/223
(58) Field of Classification Search .................. 205/223, 205/221
    See application file for complete search history.

(56) References Cited

U.S. PATENT DOCUMENTS

| | | | |
|---|---|---|---|
| 4,469,568 A | 9/1984 | Kato et al. | |
| 4,589,961 A | 5/1986 | Gershenson | |
| 5,101,242 A * | 3/1992 | Ikeda et al. | 257/9 |
| 5,177,577 A | 1/1993 | Taniguchi et al. | |
| 5,240,868 A | 8/1993 | Bae et al. | |
| 5,849,611 A * | 12/1998 | Yamazaki et al. | 438/151 |
| 6,267,861 B1 | 7/2001 | Kinard et al. | |
| 6,846,734 B2 | 1/2005 | Amos et al. | |
| 2002/0050599 A1 | 5/2002 | Lee et al. | |
| 2003/0151118 A1 | 8/2003 | Baude et al. | |
| 2005/0017302 A1 | 1/2005 | Hoffman | |
| 2005/0064690 A1 | 3/2005 | Amos et al. | |
| 2005/0106788 A1 | 5/2005 | Amos et al. | |
| 2005/0112888 A1 | 5/2005 | Burnham et al. | |
| 2005/0139823 A1 | 6/2005 | Hirakata et al. | |
| 2006/0003485 A1 | 1/2006 | Hoffman et al. | |
| 2006/0043447 A1 | 3/2006 | Ishii et al. | |
| 2006/0113603 A1 | 6/2006 | Currie | |

FOREIGN PATENT DOCUMENTS

| | | |
|---|---|---|
| JP | 06-163901 | 6/1994 |
| JP | 2003-258261 | 9/2003 |
| KR | 196503 B1 * | 7/1999 |

OTHER PUBLICATIONS

Liang et al., "Characterization of Anodic Aluminum Oxide Film and Its Application to Amorphous Silicon Thin Film Transistors", Materials Chemistry and Physics, vol. 43 (no month, 1996), pp. 166-172.*

(Continued)

*Primary Examiner*—Edna Wong
(74) *Attorney, Agent, or Firm*—Robert S. Moshrefzadeh

(57) ABSTRACT

Method of fabricating electronic devices is disclosed. The method includes the steps of forming an anodized layer that has a thickness greater than a desired thickness, and forming an electrically conductive layer on the anodized layer. The method further includes the steps of removing the conductive layer in a selected area to expose the anodized layer, and removing the exposed anodized layer until the anodized layer in the exposed area has the desired thickness.

6 Claims, 3 Drawing Sheets

OTHER PUBLICATIONS

Bartic et al., "Ta$_2$O$_5$ as gate dielectric material for low-voltage organic thin-film transistors," *Organic Electronics*, vol. 3, pp. 65-72 (2002).

Chiang et al., "Schottky-Contact Gated-Four-Probe α-Si:H TFT Structure: A New Structure to Investigate the Electrical Instability of α-Si:H TFT," *IEEE*, Electron Device Letters, vol. 19, No. 10, pp. 382-384 (Oct. 1998).

Cho, "First-principles modeling of high-k gate dielectric materials," *Computational Materials Science*, vol. 23, pp. 43-47 (2002).

Deman et al., "PMMA-TA$_2$O$_5$ bilayer gate dielectric for low operating voltage organic FETs," *Organic Electronics*, vol. 6, pp. 78-84 (2005).

Hoffman et al., "ZnO-based transparent thin-film transistors," *Applied Physics Letters*, vol. 82, No. 5, pp. 733-735 (Feb. 3, 2003).

Kao et al., "Comparison of ZnO metal-oxide-semiconductor field effect transistor and metal-semiconductor field effect transistor structures grown on sapphire by pulsed laser deposition," *J. Vac. Sci. Technol. B*, vol. 23, No. 3, pp. 1024-1028 (May/Jun. 2005).

Majewski et al., "High performance organic transistors on cheap, commercial substrates," *J. of Phys. D: Appl. Phys.*, vol. 37 pp. 3367-3372 (2004).

Majewski et al., "Flexible high capacitance gate insultators for organic field effect transistors," *J. Phys. D: Appl. Phys.*, vol. 37, pp. 21-24 (2004).

Majewski et al., "A novel gate insulator for flexible electronics," *Organic Electronics*, vol. 4, pp. 27-32 (2003).

Majewski et al., "Organic field-effect tranistors with ultrathin gate insulator," *Synthetic Metals*, vol. 144, pp. 97-100 (2004).

Majewski et al., "High capacitance organic field-effect transistors with modified gate insulators surface," *J. of Appl. Phys.*, vol. 96, No. 10, pp. 5781-5787 (Nov. 15, 2004).

Martin et al., "Source / drain contacts in organic polymer thin film transistors," *Mat. Res. Soc. Symp. Proc.*, vol. 771, pp. L6.2.1-L6.2.6 (2003).

* cited by examiner

METHOD OF FABRICATING THIN FILM TRANSISTOR

FIELD OF THE INVENTION

This invention generally relates to methods of fabricating electronic devices. The invention is particularly applicable to methods of fabricating transistors including thin film transistors.

BACKGROUND

Transistors are currently used in a wide variety of applications such as signal modulation, signal regulation and amplification, memory circuits, and signal switching. Two common types of transistors are bipolar junction transistors (BJT) and field-effect transistors (FET). A BJT typically has three terminals labeled emitter, collector, and base. An FET transistor typically has three main terminals commonly referred to as gate, drain, and source. Many FETs have a fourth terminal commonly referred to as the body.

SUMMARY OF THE INVENTION

Generally, the present invention relates to methods of fabricating electronic systems. In one embodiment, a method of fabricating an electronic device includes the steps of forming an anodized layer that has a thickness greater than a desired thickness, and forming an electrically conductive layer on the anodized layer. The method further includes the steps of removing the conductive layer in a selected area to expose the anodized layer, and removing the exposed anodized layer until the anodized layer in the exposed area has the desired thickness.

BRIEF DESCRIPTION OF DRAWINGS

The invention may be more completely understood and appreciated in consideration of the following detailed description of various embodiments of the invention in connection with the accompanying drawings, in which.

The same reference numeral used in multiple figures refers to the same or similar elements having the same or similar properties and functionalities.

DETAILED DESCRIPTION

This application teaches new electronic devices including new transistors capable of exhibiting enhanced performance stability.

Specifically, transistors are disclosed in which an electrically conductive electrode is insulated from the remainder of the transistor. The electrode is covered with two dielectric layers. A first layer is an anodized layer that substantially conforms to the surface of the electrode. The first layer allows for low cost, high-yield, and efficient manufacture because the anodization process is substantially insensitive to factors such as the surface profile and surface cleanliness of the electrode. A second dielectric layer disposed on the first layer provides enhanced performance stability that may not be achievable by the first layer alone. In the case of some transistors, the two dielectric layers isolate a gate electrode from a semiconductor region.

These transistors can be manufactured with high device yields and can exhibit improved device performance and operational lifetime.

Figure 1:
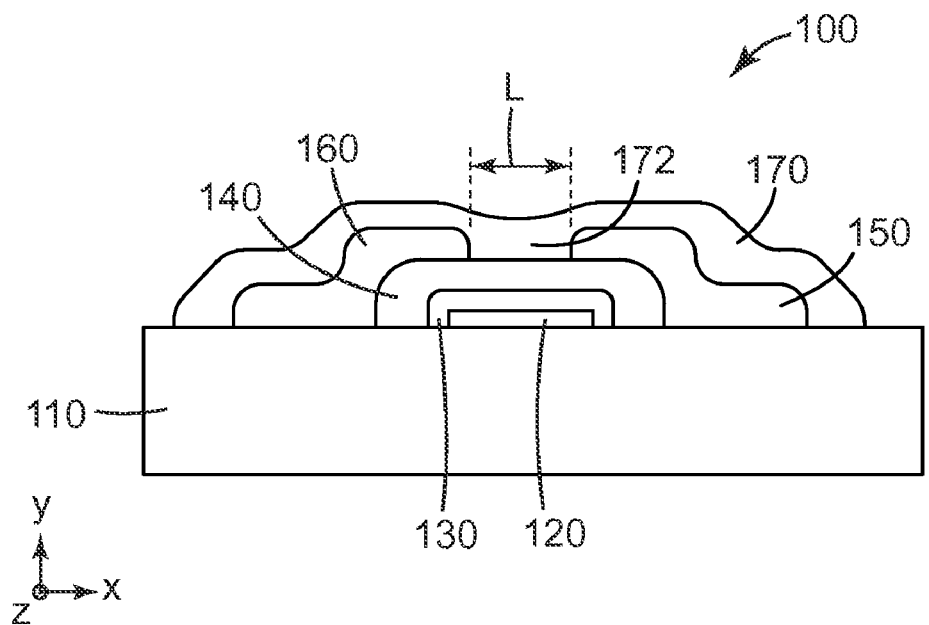
FIG. 1 is a schematic side-view of an electronic device.

FIG. 1 is a schematic view of a cross-section of an electronic device 100. Electronic device 100 includes a gate electrode 120 that is disposed on an electrically insulating substrate 110. Electronic device 100 further includes an anodized layer 130 disposed on gate electrode 120. Anodized layer 130 is formed by anodizing an electrically conductive material that is capable of being anodized. In some cases, anodized layer 130 is a dielectric. In some other cases, anodized layer 130 may be partially electrically conductive. In some cases, anodized layer 130 is a single layer. In some other cases, anodized layer 130 is a multilayer where one or more layers can be anodized layers.

In some cases, anodized layer 130 is formed by partially anodizing gate electrode 120. For example, layers 120 and 130 may be formed by first depositing and patterning a metal on the substrate. The patterned metal can then be partially anodized to form the anodized layer 130, which, in some cases, can be electrically insulating. The non-anodized portion of the deposited metal forms gate electrode 120.

In some cases, anodized layer 130 may be formed by fully or partially anodizing a layer that is different than gate electrode 120. In such cases, anodized layer 130 can be formed by, for example, first depositing on gate electrode 120 a material that is capable of being anodized. Next, the deposited material can be fully or partially anodized to form anodized layer 130.

Electronic device 100 also includes a dielectric layer 140 disposed on top of anodized layer 130. Electronic device 100 further includes electrically conductive patterned source electrode 160 and drain electrode 150 disposed on top of dielectric layer 140 and substrate 110. Electronic device 100 further includes a semiconductor layer 170 that is disposed on electrodes 150 and 160 and on dielectric layer 140 between electrodes 150 and 160.

In some cases, electronic device 100 is symmetrical, meaning that source electrode 160 and drain electrode 150 can be interchanged with little or no change in the performance and characteristics of the electronic device. In some other cases, electronic device 100 may be asymmetrical, meaning that interchanging the source and drain electrodes will result in a substantial change in the device characteristics.

As used herein, $I_D$, $I_S$, and $I_G$ refer to electrical currents flowing through drain 150, source 160, and gate 120, respectively. Similarly, $V_D$, $V_S$, and $V_G$ refer to voltages at drain 150, source 160, and gate 120, respectively.

The portion of semiconductor 170 positioned between electrodes 150 and 160 defines a channel region 172. In some cases, the channel length L, which is the separation between source electrode 160 and drain electrode 150, is in a range from about 0.5 microns to about 200 microns, or from about 0.5 microns to about 100 microns, or from about 0.5 microns to about 30 microns, or from about 1 micron to about 15 microns, or from about 1 micron to about 10 microns.

A voltage $V_{DS}=V_D-V_S$ applied between drain electrode 150 and source electrode 160 can result in currents $I_D$ and $I_S$ flowing through drain and source electrodes 150 and 160, respectively. In some cases, such as for an n-channel enhancement MOSFET, the electrical resistance of channel 172 may be reduced by applying a voltage $V_{GS}=V_G-V_S$ between gate electrode 120 and source electrode 160, greater than a threshold value $V_t$. The channel resistance is reduced because the applied above-threshold $V_{GS}$ can, for example, result in an accumulation of mobile electrons in the channel region.

In other cases, where $V_{GS}$ is less than $V_t$ (cut-off region), the electrical resistance of channel 172 can remain large and substantially insensitive to $V_{GS}$. In some such cases, the electrical resistance of channel 172 between electrodes 150 and 160 is greater than about $10^8$ ohms, or greater than about $10^{10}$ ohms, or greater than about $10^{12}$ ohms.

For $V_{GS}$ greater than $V_t$, the channel resistance can change substantially linearly as a function of the applied $V_{GS}$, for example, where $V_{DS} \leq V_{GS} - V_t$. In such cases, $I_D$ can be a linear function of both $V_{GS}$ and $V_{DS}$.

For ease of description and without loss of generality, it is assumed that electronic device 100 is in a cut-off region or an "off" state for $V_{GS}$ less than $V_t$. It will, however, be appreciated by those skilled in the art that in some cases, such as where device 100 is a p-channel enhancement MOSFET, the device will be in an "off" state for $V_{GS}$ greater than $V_t$. In such cases, for $V_{GS}$ less than $V_t$ and $V_{DS} \geq V_{GS} - V_t$, the channel resistance can change substantially linearly as a function of $V_{GS}$.

In some applications, dielectric layer 140 and a dielectric anodized layer 130 electrically insulate gate electrode 120 from the rest of electronic device 100 such as electrodes 150 and 160 and semiconductor layer 170 including channel 172. The insulation can result in very small currents $I_G$ flowing through the gate electrode. In some cases, $I_G$ is less than about $10^{-10}$ amps, or less than about $10^{-11}$ amps, or less than about $10^{-12}$ amps.

In cases where $I_G$ is very small, drain current $I_D$ and source current $I_S$ are substantially equal when the transistor is in the "on" state. In some cases, the magnitude of the difference between $I_D$ and $I_S$ is less than about $10^{-3}$ amps, or less than about $10^{-4}$ amps, or less than about $10^{-5}$ amps.

In some cases, gate electrode 120 can be a metal and anodized layer 130 can be formed by anodizing an outer portion of the metal including the outer surface of the metal. For example, gate electrode can be an aluminum gate electrode and anodized layer 130 can be anodized aluminum. For example, an aluminum layer may be first deposited on substrate 110 and patterned using, for example, conventional photolithography. The patterned aluminum layer can then be partially anodized to form anodized aluminum layer 130. The anodization process can be, for example, similar to those disclosed in, for example, U.S. Pat. No. 6,267,861 (Kinard et al.). In some cases, gate electrode 120 can be the non-anodized portion of the patterned aluminum layer. During the anodization process some portions of the patterned aluminum layer may be protected from being anodized for subsequent connection to, for example, a controller circuitry.

In a typical anodization process, a metal layer to be anodized is biased at a voltage and immersed in an anodization solution that can include, for example, tartaric acid and ethylene glycol. In some cases, the anodization process can require the immersion to last for minutes, for example, five minutes during which the anodization solution can be circulated or agitated. During the immersion, the anodization solution tends to reach and wet the surface of the metal layer even in areas where the metal layer may be covered by, for example, a small particle. Such penetration by the anodization solution can result in substantially uniform anodization of the metal layer even in areas where the metal is covered by a small foreign object such as a small dirt particle.

Consequently, a subsequent removal of the particle does not result in a pinhole in the anodized layer which would expose the metal layer. As a result, an advantage of using an anodization process to form anodized layer 130 is that the anodization substantially conforms to the surface profile of the layer being anodized even if in some locations the surface is covered with, for example, small particles. In contrast, if anodized layer 130 is replaced with a dielectric layer that is formed by, for example, vapor depositing a dielectric material onto the gate electrode, an area of the gate electrode covered by a particle may not be coated during the deposition process, resulting in the gate electrode being exposed in the area after the particle is removed, for example, during further processing.

Another advantage of using an anodization process to form anodized layer 130 is that anodization can result in a substantially uniform insulation of the gate electrode. For example, during the anodization process more electrical current tends to flow through an area that is not as anodized, and therefore not as insulating, as the neighboring regions. The additional current intensifies the anodization of the area until the entire anodized region becomes uniformly insulating.

In some cases, gate electrode 120 can be any material that is capable of being at least partially anodized to form anodized layer 130. In general, gate electrode 120 can be any anodizable metal. For example, gate electrode 120 can be aluminum, tantalum, niobium, titanium, zirconium, beryllium, magnesium, yttrium, zinc, copper, tin, bismuth, silicon, and hafnium. As another example, gate electrode 120 can be an alloy of any anodizable metal or a combination of anodizable metals.

Source electrode 160 and drain electrode 150 may be any metal that may be desirable in an application. Exemplary metals that may be used to fabricate the drain and source electrodes include aluminum, gold, copper, and silver.

In some cases, the source and drain electrodes can be formed by first depositing an electrically conductive layer, such as a metal, on anodized layer 130 and substrate 110. The deposited conductive layer can then be patterned, for example, by using an etchant in a conventional photolithography process. In some cases, during the patterning process the etchant may attack and etch anodized layer 130. For example, the gate electrode 120 may be made of aluminum, anodized layer 130 may be anodized aluminum, and the deposited conductive layer may be aluminum. The deposited conductive layer may be patterned using an aluminum etchant such as a solution that includes phosphoric acid, acetic acid, nitric acid, and water described in, for example, U.S. Pat. No. 4,589,961 (Gershenson). In such a case, the etching solution is also capable of etching anodized layer 130, which may not be desirable.

In some cases, to prevent the etching of anodized layer 130 during patterning of the source and drain electrodes, anodized layer 130 may be protected by covering the anodized layer with a dielectric layer 140 that does not etch or etches very little by an etchant used to form the source and drain electrodes. For example, the dielectric layer can be made of silicon dioxide ($SiO_2$) that does not tend to react with etchants suitable for etching, for example, aluminum.

In some cases, the presence of dielectric layer 140 has the added advantage of improving device stability. In particular, dielectric layer 140 can stabilize the drain current $I_D$ with time during operation of device 100.

Electronic device 100 can, for example, be a transistor, such as a metal oxide semiconductor field effect transistor (MOSFET) or an insulated gate bipolar transistor (IGBT). In general, electronic device 100 can be any device where it may be desirable to have a stack of two dielectric layers where one layer is an anodized layer and the other layer improves operational stability.

Figure 2:
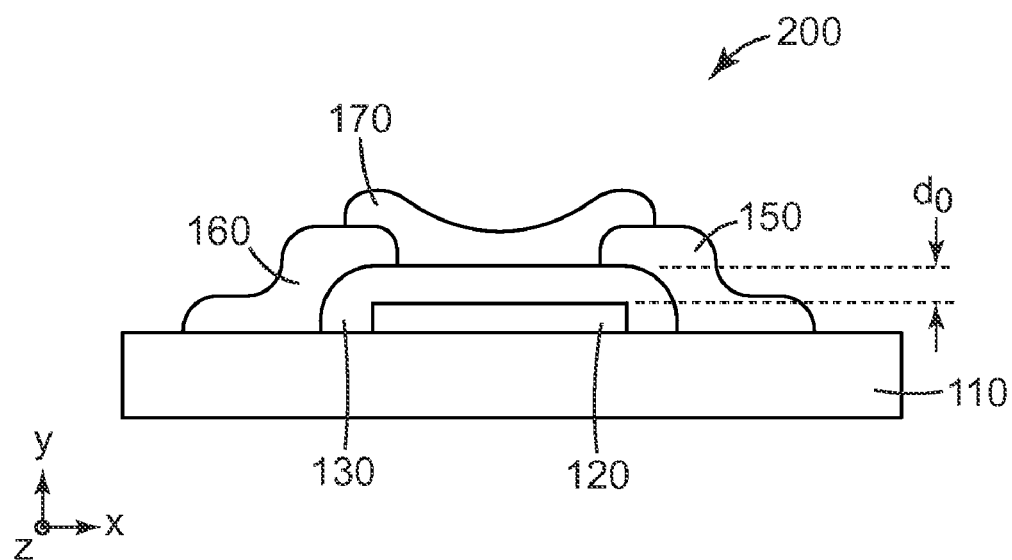
FIG. 2 is a schematic side-view of another electronic device.

In some applications, electronic device 100 may not include dielectric layer 140 such as electronic device 200 shown schematically in FIG. 2. In electronic device 200, anodized layer 130 has a desired thickness $d_0$. Electronic device 200 can be fabricated using a process schematically described in FIGS. 3A-3E.

First, a patterned electrically conductive layer 320 is formed by depositing and patterning an electrically conductive layer, such as a metal layer, on substrate 110. Layer 320 may be deposited using any suitable known method such as thermal evaporation, e-beam evaporation, sputtering, flame hydrolysis, casting, plasma deposition, or any other deposition method that may be desirable in an application. In some cases, conductive layer 320 can be the gate electrode. In some other cases, a portion of conductive layer 320 can become the gate electrode.

Next, an anodized layer 330 is formed on conductive layer 320. Anodized layer 330 has an average thickness d, where d is greater than a desired final thickness $d_0$. In some cases, patterned electrically conductive layer 320 is anodizable, and anodized layer 330 is formed by anodizing patterned electrically conductive layer 320 until the anodized portion of electrically conductive layer 320 has a thickness d that is greater than the desired thickness $d_0$. In such cases, the non-anodized portion of electrically conductive layer 320 forms gate electrode 120 as shown schematically in FIG. 3B.

In some other cases, patterned electrically conductive layer 320 may be covered with an anodizable metal layer that is partially or fully anodized to form anodized layer 330. In such cases, patterned electrically conductive layer 320 can be the gate electrode similar to gate electrode 120.

Figure 3A:
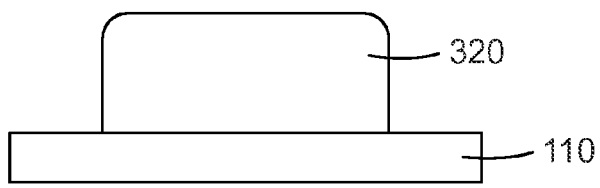
FIGS. 3A-3E are schematic representations of devices at intermediate stages or steps in a process for fabricating an electronic device.
Figure 3B:
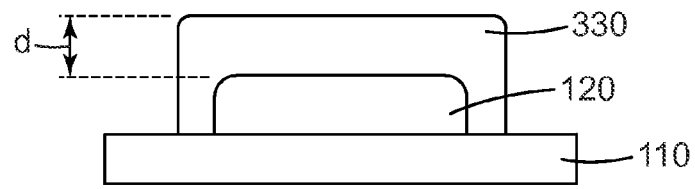
Figure 3C:
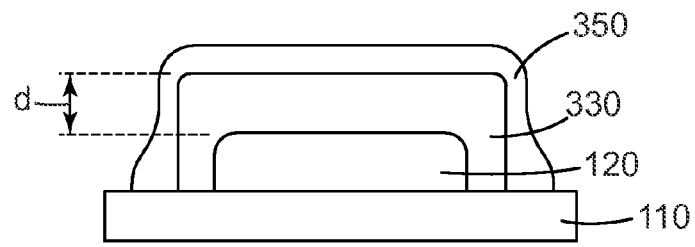
Figure 3D:
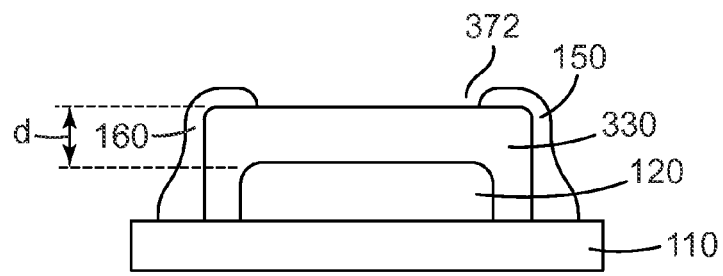

Next, an electrically conductive layer 350 is deposited on anodized layer 330 as shown schematically in FIG. 3C. In some cases, electrically conductive layers 320 and 350 are made of the same electrically conductive material, such as aluminum. In general, electrically conductive layers 320 and 350 may or may not be made of the same electrically conductive material.

The next step includes using a first etchant in an etching process to pattern electrically conductive layer 350 to form drain and source electrodes 150 and 160, respectively. The etching process also exposes anodized layer 330 in area 372 as shown schematically in FIG. 3D. The etching process can be any known etching process that may be suitable in an application. Known etching processes include wet or dry chemical etching, and reactive ion etching. The first etchant can be any etchant that is capable of etching conductive layer 350. In some cases, electrically conductive layer is an aluminum layer and the first etchant is an etching solution that etches the aluminum layer using a spray process.

Figure 3E:
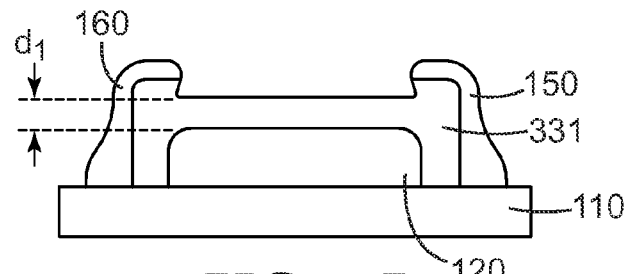

Next, a second etchant is used to etch anodized layer 330 in exposed area 372 until thickness d of the anodized layer is reduced to $d_1$ which is substantially equal to the desired thickness $d_0$ as shown schematically in FIG. 3E, thus forming anodized layer 331.

Next, a semiconductor layer similar to semiconductor layer 170 and/or a dielectric layer similar to dielectric layer 140 may be disposed on electrodes 150 and 160 and anodized layer 331.

In some cases, some or all the steps described in connection with FIGS. 3A-3E may be carried out sequentially. In general, however, the described steps need not be carried out sequentially. Furthermore, there may be additional steps included in the described fabrication process, such as rinsing steps, baking steps, and/or photolithographic steps such as coating and exposing a photoresist.

Figure 4:
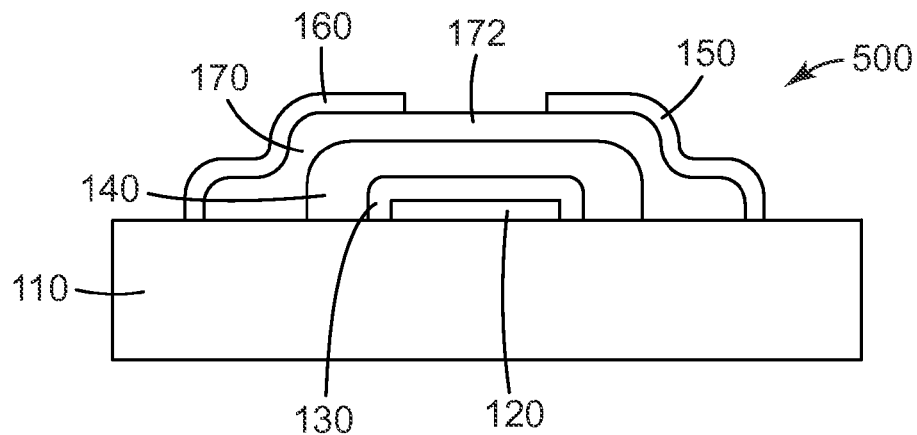
FIG. 4 is a schematic side-view of an electronic device.

FIG. 4 is a schematic view of a cross-section of an electronic device 500. In electronic device 500, semiconductor layer 170 is disposed between dielectric layer 140 and the source and drain electrodes 160 and 150, respectively. In some cases, since semiconductor layer 170 covers anodized layer 130, dielectric layer 140 may not be needed to prevent the etching of anodized layer 130 during patterning of electrodes 150 and 160. In such cases, electronic device 500 may still include layer 140 in order to improve the performance of device 500 by, for example, stabilizing current $I_D$ as a function of time at a desired operating point.

Some advantages associated with the disclosed devices are illustrated by the following example. The particular materials, amounts and dimensions recited in this example, as well as other conditions and details, should not be construed to unduly limit the present invention. A test device similar to the device of FIG. 4 was fabricated. First, 200 angstroms of $SiO_2$ tie-layer was sputter coated onto a glass substrate for improving adhesion between the glass substrate and subsequent layers. Next, 1500 angstroms of aluminum was sputtered onto the tie-layer and patterned. Next, the aluminum layer was partially anodized resulting in a 975 angstroms thick anodized aluminum layer which was essentially aluminum oxide ($Al_2O_3$). The remaining 525 angstroms of the sputtered aluminum layer formed the gate electrode.

To form the dielectric layer, 200 angstroms of $SiO_2$ was e-beam vapor deposited onto the anodized aluminum layer. Next, 550 angstroms of ZnO was sputtered onto the $SiO_2$ dielectric layer to form the semiconductor layer. Next, the source and drain electrodes were formed by sputter coating and patterning 1000 angstroms of aluminum onto the ZnO layer. The channel length (distance between the source and drain electrodes) was 50 microns. The channel width was 500 microns.

A control device was also fabricated using the same process and device parameters except that the control device did not have an $SiO_2$ dielectric layer. Both the test device and the control device were activated by applying a 2 volt DC signal to the drain electrodes. The source electrodes were grounded. A 250 Hertz square-wave voltage signal with a 1:100 or 1% duty cycle (the period of the square-wave was 100 times each pulse-width) was applied to each gate electrode. The square-wave had a maximum value of 20 volts corresponding to the "on" state of the device and a minimum value of −5 volts corresponding to the "off" state of the device.

Figure 5:
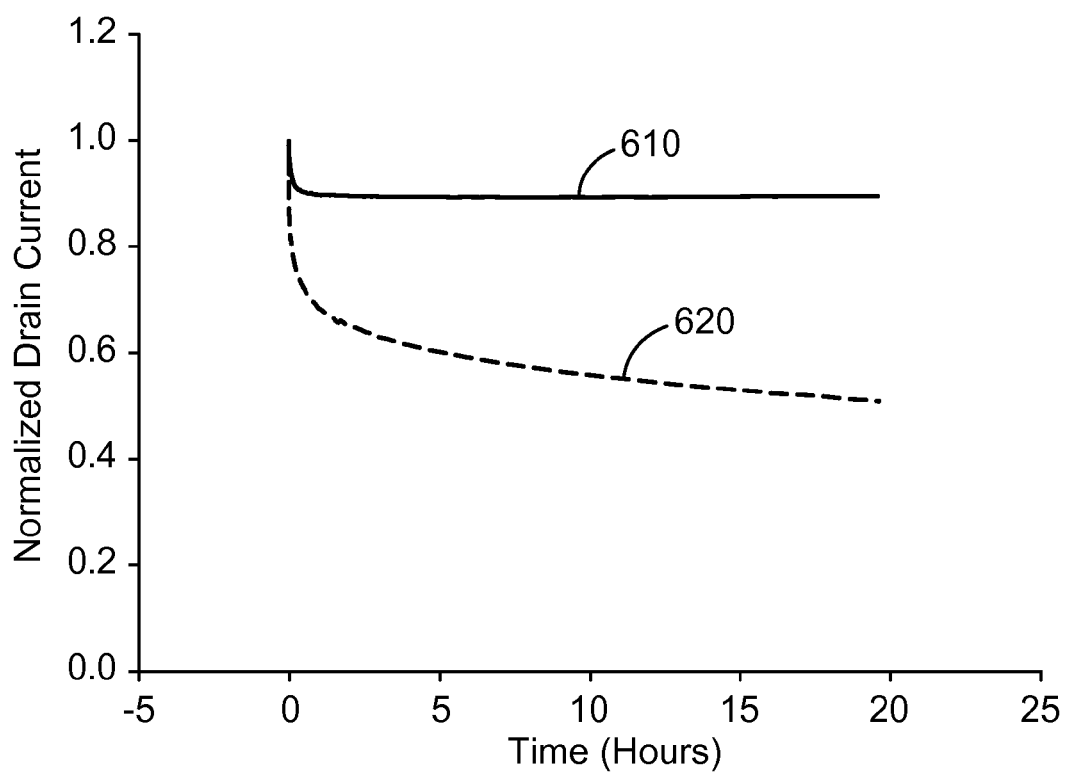
FIG. 5 is a plot of normalized drain current as a function of operation time for two transistors.

For each device the drain current $I_D$ was tracked during the "on" state. The results are shown in FIG. 5, where the vertical axis is normalized on-current and the horizontal axis is time. Curve 610 shows the drain current $I_D$ of the test device and curve 620 shows the drain current $I_D$ of the control device. FIG. 5 clearly shows that the presence of the $SiO_2$ dielectric layer in the test device substantially improved the stability of drain current $I_D$.

Curve 620 indicates that the threshold voltage $V_t$ for the control device gradually increased with operation time. In contrast, curve 610 indicates that the threshold voltage of the test device remained essentially unchanged with operation time after an initial stabilization period.

As used herein, terms such as "vertical", "horizontal", "above", "below", "left" "right", "upper" and "lower", "top" and "bottom" and other similar terms, refer to relative positions as shown in the figures. In general, a physical embodiment can have a different orientation, and in that case, the terms are intended to refer to relative positions modified to the actual orientation of the device. For example, even if the construction in FIG. 1 is inverted as compared to the orientation in the figure, gate electrode 120 is still considered to be on "top" of substrate 110.

All patents, patent applications, and other publications cited above are incorporated by reference into this document as if reproduced in full. While specific examples of the invention are described in detail above to facilitate explanation of various aspects of the invention, it should be understood that the intention is not to limit the invention to the specifics of the examples. Rather, the intention is to cover all modifications, embodiments, and alternatives falling within the spirit and scope of the invention as defined by the appended claims.

What is claimed is:

1. A method of fabricating an electronic device, comprising the steps of:
   (a) forming an anodized layer having a thickness greater than a desired thickness;
   (b) forming an electrically conductive layer on the anodized layer;
   (c) removing the conductive layer in a selected area to expose the anodized layer; and
   (d) removing the exposed anodized layer until the anodized layer in the exposed area has the desired thickness.

2. The method of claim 1, wherein steps (a) through (d) are carried out sequentially.

3. The method of claim 1, wherein the step of removing the conductive layer comprises etching the conductive layer.

4. The method of claim 1, wherein the step of removing the exposed anodized layer comprises etching the exposed anodized layer.

5. The method of claim 1, wherein the steps of removing the conductive layer and the exposed anodized layer comprise etching the conductive layer and the exposed anodized layer.

6. The method of claim 5, wherein the etching of the conductive layer and the exposed anodized layer is accomplished using a same etchant.

* * * * *

UNITED STATES PATENT AND TRADEMARK OFFICE
CERTIFICATE OF CORRECTION

| | | |
|---|---|---|
| PATENT NO. | : 7,655,127 B2 | Page 1 of 1 |
| APPLICATION NO. | : 11/563454 | |
| DATED | : February 2, 2010 | |
| INVENTOR(S) | : Mike W Bench et al. | |

It is certified that error appears in the above-identified patent and that said Letters Patent is hereby corrected as shown below:

Page 2

Column 2; Other Publications; Line 9, Delete "tranistors" and insert
-- transistors --, therefor.

Column 2; Other Publications; Line 12, Delete "insulators" and insert
-- insulator --, therefor.

Column 6

Line 62; Delete ""left"" and insert -- "left", --, therefor.

Signed and Sealed this

First Day of June, 2010

David J. Kappos
*Director of the United States Patent and Trademark Office*